(12) United States Patent
Kuroda

(10) Patent No.: US 6,187,602 B1
(45) Date of Patent: Feb. 13, 2001

(54) CMOS INTEGRATED CIRCUIT DEVICE AND ITS INSPECTING METHOD AND DEVICE

(75) Inventor: Tadahiro Kuroda, Yokohama (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/521,049

(22) Filed: Mar. 8, 2000

Related U.S. Application Data

(62) Division of application No. 08/831,193, filed on Apr. 2, 1997, now Pat. No. 6,051,442.

(30) Foreign Application Priority Data

Apr. 30, 1996 (JP) .................................................. 8-109562

(51) Int. Cl.$^7$ .................................................. H01L 21/66
(52) U.S. Cl. ................................ 438/17; 438/14; 257/48; 324/765
(58) Field of Search ...................... 438/6, 10, 11, 438/12, 14, 17, 199, 200, 292; 257/355, 48; 324/765, 769

(56) References Cited

U.S. PATENT DOCUMENTS

| | | |
|---|---|---|
| 4,692,870 | 9/1987 | Mandaley . |
| 5,057,774 | 10/1991 | Verhelst et al. . |
| 5,304,839 | 4/1994 | Chen et al. . |
| 5,457,412 | 10/1995 | Tamba et al. . |
| 5,491,665 | 2/1996 | Sachdeu . |
| 5,524,095 | 6/1996 | Someya et al. . |
| 5,625,300 | * 4/1997 | Sachdev ........................ 324/765 |
| 5,694,063 | 12/1997 | Burlison et al. . |
| 5,731,700 | 3/1998 | McDonald . |

* cited by examiner

Primary Examiner—Kevin M. Picardat
(74) Attorney, Agent, or Firm—Hogan & Hartson, LLP

(57) ABSTRACT

The disclosed device and method can inspect the CMOS integrated circuit devices at high precision on the basis of the static current of the voltage supply connected thereto. A CMOS integrated circuit comprises: at least one CMOS circuit having at least one P-channel MOS transistor and at least one N-channel MOS transistor; a first pad connected to a source of the P-channel MOS transistor; a second pad connected to a source of the N-channel MOS transistor; a third pad connected to an N-type substrate or an N-type well formed with the P-channel MOS transistor; and a fourth pad connected to a P-type substrate or a P-type well formed with the N-channel MOS transistor.

2 Claims, 3 Drawing Sheets

CMOS INTEGRATED CIRCUIT DEVICE AND ITS INSPECTING METHOD AND DEVICE

This is a division of application Ser. No. 08/831,193 now U.S. Pat. No. 6,051,442 filed Apr. 2, 1997, which application is hereby incorporated by reference in its entirety.

BACKGROUND OF THE INVENTION

1. Field of the Invention

The present invention relates to a CMOS integrated circuit device and an inspecting method and an inspecting device thereof.

2. Description of the Prior Art

In general, when the threshold value of a MOSFET is reduced, since the current driving capability of the MOSFET increases, the circuit can operate at high speed, so that it is possible to realize a high performance LSI. On the. other hand, in the case where the supply voltage is reduced to lower the power consumption, it is possible to realize a low power consumption, without decreasing the operation speed, by reducing the threshold value of the MOSFET.

By the way, in the case where a CMOS integrated circuit provided with CMOS circuits having P-channel MOS transistors and N-channel MOS transistors is required to be inspected, there has been widely adopted such an inspection method that a defective CMOS integrated circuit can be selectively rejected by checking the static current of the voltage supply. In this inspection method, after a supply voltage is applied to the CMOS integrated circuit, an H- or L-level signal is given to an input terminal thereof, to measure the current flowing through the voltage supply. In this case, when a large current beyond a predetermined value flows therethrough, the chip is regarded as being mixed with some defective CMOS circuits and thereby selectively rejected. The reason why such method can be used is that the CMOS circuit is provided with such a feature that voltage supply current (a static supply voltage current) does not flow on condition that the input of the CMOS circuit does not change (i.e., in a static status).

In this case, however, when the threshold value of the MOSFET is reduced, since the sub-threshold current of the MOSFET increases and thereby a relatively large static voltage supply current flows even through a non-defective chip, this inspection method cannot be adopted. As a result, there exists such a problem in that the defective chips are erroneously selected and put on the market or that an excessive inspection cost is required to prevent the defective chips from being mixed with the non-defective chips.

SUMMARY OF THE INVENTION

With these problems in mind, therefore, it is the object of the present invention to provide a CMOS integrated circuit device and its inspecting method and device, which can inspect the static current flowing through the voltage supply of the CMOS circuits precisely.

To achieve the above-mentioned object, the first aspect of the present invention provides a CMOS integrated circuit device, comprising: at least one CMOS circuit having at least one P-channel MOS transistor and at least one N-channel MOS transistor; a first pad connected to a source of the P-channel MOS transistor; a second pad connected to a source of the N-channel MOS transistor; a third pad connected to an N-type substrate or an N-type well formed with the P-channel MOS transistor; and a fourth pad connected to a P-type substrate or a P-type well formed with the N-channel MOS transistor.

Further, it is preferable that when shipped, the third pad is so connected that a first supply potential can be applied thereto; and the fourth pad is so connected that a second supply potential can be applied thereto.

Further, the second aspect of the present invention provides a method of inspecting a CMOS integrated circuit device, which comprises the steps of: applying a first supply potential to the first pad; applying a second supply potential lower than the first supply potential to the second pad; applying a supply potential higher than the first supply potential to the third pad; applying a supply potential lower than the second supply potential to the fourth pad; and measuring current flowing through the first or second pad for inspection, to selectively reject the CMOS integrated circuit device.

Further, the third aspect of the present invention provides a method of inspecting a CMOS integrated circuit device, which comprises the steps of: applying a supply potential higher than a first supply potential to the third pad; applying a supply potential lower than a second supply potential to the fourth pad; applying a third supply potential lower than the first supply potential but higher than the second supply potential to the first pad; applying a fourth supply potential lower than the third supply potential but higher than the second supply potential to the second pad, the second supply potential being lower than the first supply potential.

Further, the fourth aspect of the present invention provides a method of inspecting a CMOS integrated circuit device having a P-channel MOS transistor and an N-channel MOS transistor, which comprises the steps of: applying a supply potential higher than that for normal use to an N-type substrate or an N-type well formed with the P-type MOS transistor; and applying a potential lower than that for normal use to a P-type substrate or a P-type well formed with the N-type MOS transistor.

Further, the fifth aspect of the present invention provides a device for inspecting a CMOS integrated circuit device, which comprises: first means for applying a first supply potential to the first pad, and a second supply potential lower than the first supply potential to the second pad; second means for applying a supply potential higher than the first supply potential to the third pad, and a supply potential lower than the second supply potential to the fourth pad; and third means for selectively rejecting the CMOS integrated circuit device on the basis of current flowing through the first or second pad.

Further, the sixth aspect of the present invention provides a device for inspecting a CMOS integrated circuit device as defined by the first aspect, which comprises: first means for applying a supply potential higher than a first supply potential to the third pad, and a supply potential lower than the second supply potential to the fourth pad; and second means for applying a third supply potential lower than the first supply potential but higher than the second supply potential to the first pad, and a fourth supply potential lower than the third supply potential but higher than the second supply potential to the second pad, the second supply potential being lower than the first supply potential.

DETAILED DESCRIPTION OF THE PREFERRED EMBODIMENTS

Figure 1:
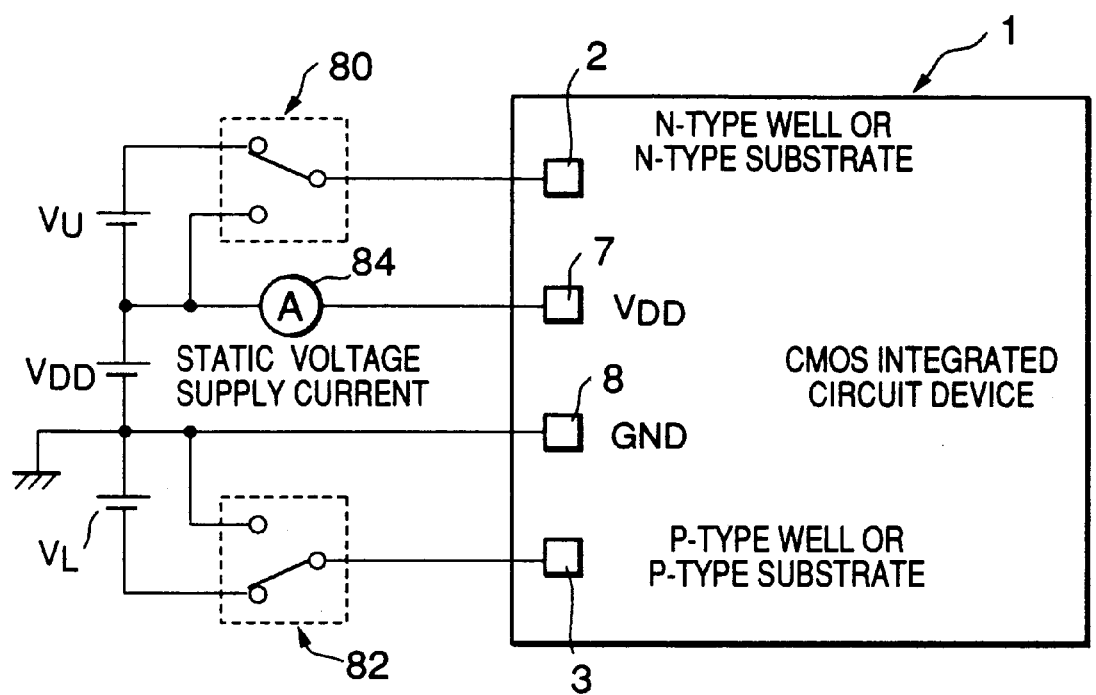
FIG. 1 is a block diagram showing a first embodiment of the CMOS integrated circuit device according to the present invention.

FIG. 1 shows a first embodiment of the CMOS integrated circuit device according to the present invention. In FIG. 1, a CMOS integrated circuit 1 comprises CMOS elements (not shown) each composed of a P-channel MOS transistor and an n-channel MOS transistor, and four pads 2, 3, 7 and 8. The pad 2 is connected to an N-type well or an N-type substrate (an N-type well or substrate is referred to as an N-type semiconductor substrate, hereinafter) in which the P-channel MOS transistors are formed, and the pad 3 is connected to a P-type well or a P-type substrate (a P-type well or substrate is referred to as a P-type semiconductor substrate, hereinafter) in which the N-channel MOS transistors are formed. Further, the pad 7 is connected to a drive supply voltage $V_{DD}$ and the pad 8 is connected to a ground supply voltage GND.

The method of inspecting the static current of the voltage supply of the first embodiment of the CMOS integrated circuit device according to the present invention will be described hereinbelow.

When the static voltage supply current is required to be inspected, a potential $V_L$ lower than the ground potential GND is given to the P-type semiconductor substrate via the pad 3 by use of a switch circuit 82, and further a potential higher than the driving potential $V_{DD}$ is given to the N-type semiconductor substrate via the pad 2 by use of a switch circuit 80, as shown in FIG. 1. Further, any one of the driving potential $V_{DD}$ or the ground potential GND is given to other input pad thereof. For instance, the driving potential $V_{DD}$ is given to the pad 7 and the ground potential GND is give to the pad 8, as shown. Under these conditions, the threshold values of the NMOS transistor formed in the P-type semiconductor substrate and the PMOS transistor formed in the N-type semiconductor substrate both increase due to the back gate bias voltage effect. In this status, the static current of the CMOS integrated circuit device 1, for instance the current flowing through the pad 7 or 8 is measured by use of an ammeter 84. When the measured current value is higher than a predetermined value, the CMOS integrated circuit 1 is selectively rejected as a defective device.

Here, the potential given to the substrate or the well region differs according to the device characteristics (coefficient of back gate bias voltage effect and the threshold value thereof). For instance, when −2V is applied to the P-type substrate or P-type well and further +2V is applied to the N-type substrate or N-type well, the threshold values of the PMOS and NMOS increase by about 0.4V, so that the static voltage supply current can be measured. Further, although the predetermined value (the reference value for selection) of the static voltage supply current differs according to the integration density, the value is about 10 μA, for instance.

Further, for the other inspection, the ground potential is given to the P-type substrate or P-type well through the pad 3, and the supply potential is given to the N-type substrate or N-type well through the pad 2. As a result, the MOSFETs can operate in the original characteristics, so that the performance of the integrated circuit can be correctly evaluated.

When shipped, the pad 3 connected to the P-type substrate or the P-type well is bonded to a ground pin, and the pad 2 connected to the N-type substrate or the N-type well is also bonded to a voltage supply pin.

As explained above, in the first embodiment of the present invention, in the inspection of the static supply voltage current, since the threshold value of the MOS transistor is increased, it is possible to inspect the static supply voltage current precisely, so that defective integrated circuits can be selectively rejected easily.

Further, in the above-mentioned first embodiment of the CMOS integrated circuit device, since a large current will not flow through the semiconductor substrate or the well region, there arise no problems even if only a single pad is used and a fine wire is used and boned to each pad. Further, when a multi-layer interconnection technique is adopted, the wiring to the pads can be further facilitated. In addition, since it is unnecessary to often connect the pads to the semiconductor substrates and the well regions, the wiring work is easy.

Figure 2:
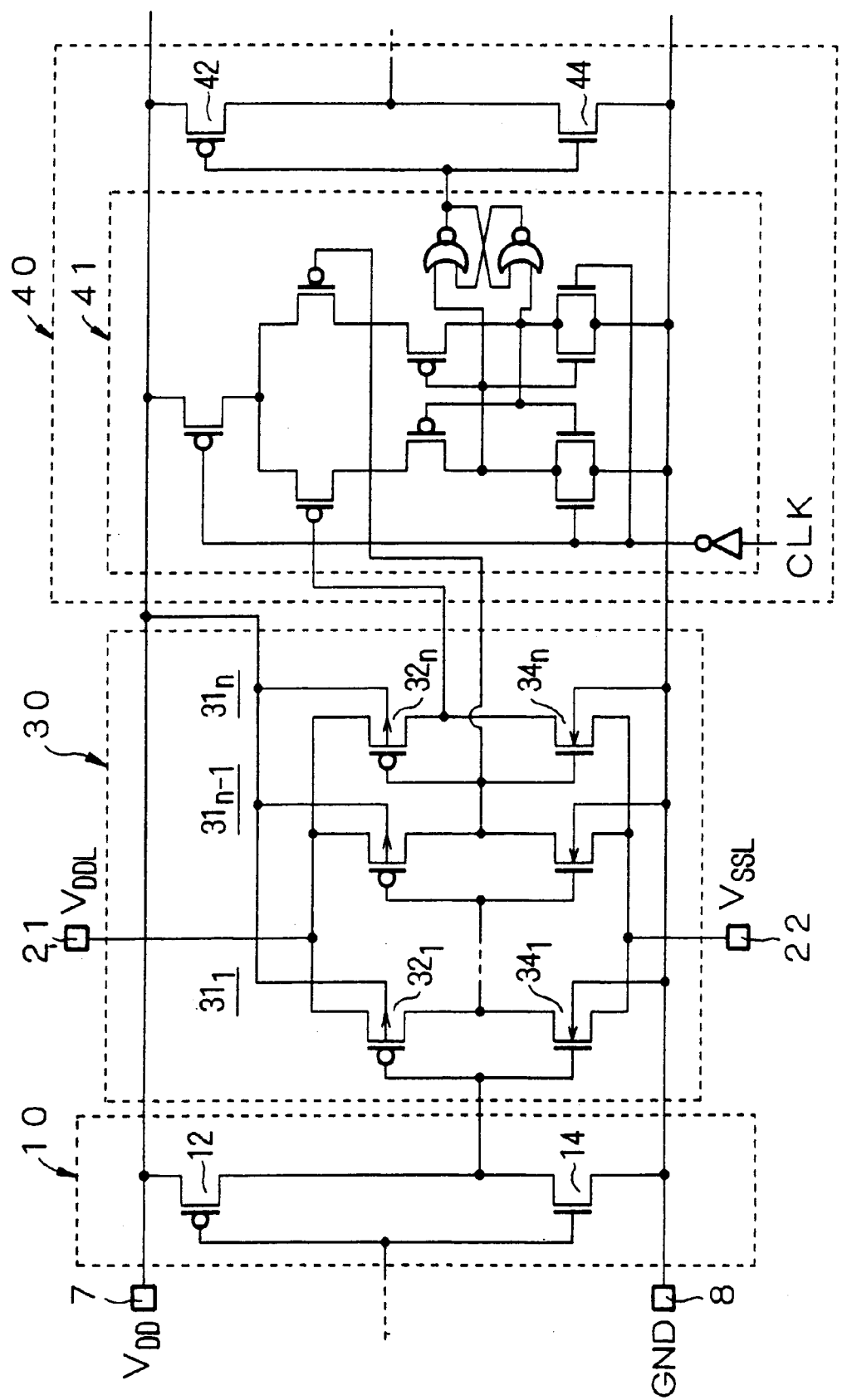
FIG. 2 is a block diagram showing a second embodiment of the CMOS integrated circuit device according to the present invention.

FIG. 2 shows a second embodiment of the CMOS integrated circuit device according to the present invention. In FIG. 2, a CMOS integrated circuit 1 comprises a first circuit 10, a second circuit 30, a third circuit 40, and four pads 7, 8, 21, and 22. The first circuit 10 has a CMOS inverter composed of a PMOS transistor 12 and an NMOS transistor 14. A source of the PMOS transistor 12 is connected to the pad 7 to which a supply potential $V_{DD}$ is applied in the normal use. Further, an N-type substrate or an N-type well in which the PMOS transistor 12 is formed is connected to the pad 7. Further, a source of the NMOS transistor 14 is connected to the pad 8 to which the ground potential GND is applied in the normal use. Further, a P-type substrate or a P-type well in which the NMOS transistor 14 is formed is connected to the pad 8. Further, the signal generated within the first circuit 10 has an amplitude between $V_{DD}$ and GND.

On the other hand, a potential $V_{DDL}$ ($\leq V_{DD}$) lower than the potential $V_{DD}$ is applied to the pad 21 both in the normal use and in the inspection, and a potential $V_{SSL}$ ($\geq$GND) higher than the potential GND is applied to the pad 22 both in the normal use and in the inspection.

The second circuit 30 is composed of n-units of CMOS inverter circuits $31_1, \ldots, 31_n$, and each CMOS inverter circuit $31_i$ (i=1, ..., n) is made up of a PMOS transistor $32_i$ and an NMOS transistor $34_i$. An input terminal of each CMOS inverter circuit $31_1$ is connected to an output terminal of the CMOS inverter circuit of the first circuit 10. Further, an output terminal of each CMOS inverter circuit $31_i$ (i=1, ..., n-1) is connected to an input terminal of each CMOS inverter circuit $31_{i+1}$, respectively. A source of each PMOS transistor $32_i$ (i=1, ..., n) is connected to the pad 21, and further an N-type substrate or an N-type well in which these PMOS transistors $32_1, \ldots, 32_n$ are formed is connected to the pad 7. Further, a source of each NMOS transistor $34_i$ (i=1, ..., n) is connected to the pad 22, and further a P-type substrate or a P-type well in which these NMOS transistors $34_1, \ldots, 34_n$ are formed is connected to the pad B. Further, the signal generated within the second circuit 2 has an amplitude between $V_{DDL}$ and $V_{SSL}$.

The third circuit 40 comprises a latch-type sense amplifier flip-flop circuit 41 and a CMOS inverter circuit composed of a PMOS transistor 42 and an NMOS transistor 44. The latch-type sense amplifier flip-flop circuit 41 is used to detect a small-amplitude signal and to hold the detected signal in the flip-flop circuit as data having an amplitude between $V_{DD}$ and GND; that is, to convert the detected small-amplitude signal into a signal having an amplitude between $V_{DD}$ and GND. This latch-type sense amplifier flip-flop circuit 41 is disclosed in detail by Matsui, M et al, "200 MHz Video Compression Macro-cells Using Low-Swing Differential Logic", ISSCC Dig, Tech. Papers, pp76 to 77, February 1994.

Further, in this second embodiment, the potentials at both output and input terminals of the final-stage CMOS inverter circuit $31_n$ of the second circuit 30 are applied to the sense amplifier circuit 41 as two input signals, and further an output of the sense amplifier 41 is applied to the CMOS inverter circuit composed of the PMOS transistor 42 and the NMOS transistor 44 through the flip-flop circuit. Here, the CMOS inverter .circuit and the latch-type sense amplifier flip-flop circuit 41 are driven between the supply potential $V_{DD}$ and the ground potential GND. Therefore, the output signal generated by the third circuit 40 has an amplitude between $V_{DD}$ and GND.

Further, a P-type substrate or a P-type well in which the NMOS transistors for constituting the third circuit 40 are formed is connected to the ground potential GND, and an N-type substrate or an N-type well in which the PMOS transistors for constituting the third circuit 40 are formed is connected to the drive potential. The threshold values of the transistors for constituting the first and third circuits 10 and 40 are set to a higher value, respectively. However, the threshold values of the transistors for constituting the second circuit 30 are set to a lower value, because the second circuit can be operated at high speed even at a lower potential.

The method of inspecting the static voltage supply current of the second embodiment of the CMOS integrated circuit (the static voltage supply current of the second circuit 30, in particular) will be described in detail hereinbelow. Now, the assumption is made that $V_{DD}$ is 3.0V; $V_{DDL}$ is 1.0V; and $V_{SSL}$ is 0V.

In the inspection of the static voltage supply current, a potential (e.g., −2V) lower than the potential GND in the normal use is applied to the pad 8, and a potential (e.g., 5V) higher than the potential $V_{DD}$ (e.g., 3V) in the normal use is applied to the pad 7. Further, a potential $V_{DDL}$ is applied to the pad 21, and a potential $V_{SSL}$ is applied to the pad 22. Under these conditions, back gate bias voltages of −4V and −2V are applied to each PMOS transistor $32_i$ (i=1, . . . , n) and each NMOS transistor $34_i$ (i=1, . . . , n) of the second circuit 30, respectively. These back gate bias voltages are higher than those in the normal use, because in the normal use, these are −2V in the case of each PMOS transistor $32_i$ (i=1, . . . , n) and 0V in the case of each NMOS transistor $34_i$ (i=1, . . . , n).

Accordingly, only in the inspection of the static voltage supply current, the threshold values of the transistors for constituting the second circuit 30 are increased, with the result that it is possible to inspect the static current of the voltage supply more precisely. Further, the static current of the voltage supply can be inspected by measuring the current flowing through the pads 21 or 22, to separate and reject the integrated circuit only when the measured value exceeds a predetermined value, respectively.

In the inspection, although the level of the signal applied from the first circuit 10 to the second circuit 30 is lower than the potentials $V_{SSL}$ and higher than the potential $V_{DDL}$ both applied to the second circuit 30, no dc current will flow through the input stage circuit of the second circuit 30.

Further, although the level of the signal applied from the second circuit 30 to the third circuit 40 is the potential $V_{SSL}$ or $V_{DDL}$ lying between the drive potential $V_{DD}$ and the ground potential GND, when the clock signal CLK is set to "L" (=GND), no dc current will flow through the first stage sense amplifier circuit 41 of the third circuit 40. Here, since the sense amplifier circuit 41 outputs the signal having a level between $V_{DD}$ and GND, no dc current will flow through the after-stage circuits connected to the sense amplifier circuit 41.

Figure 3:
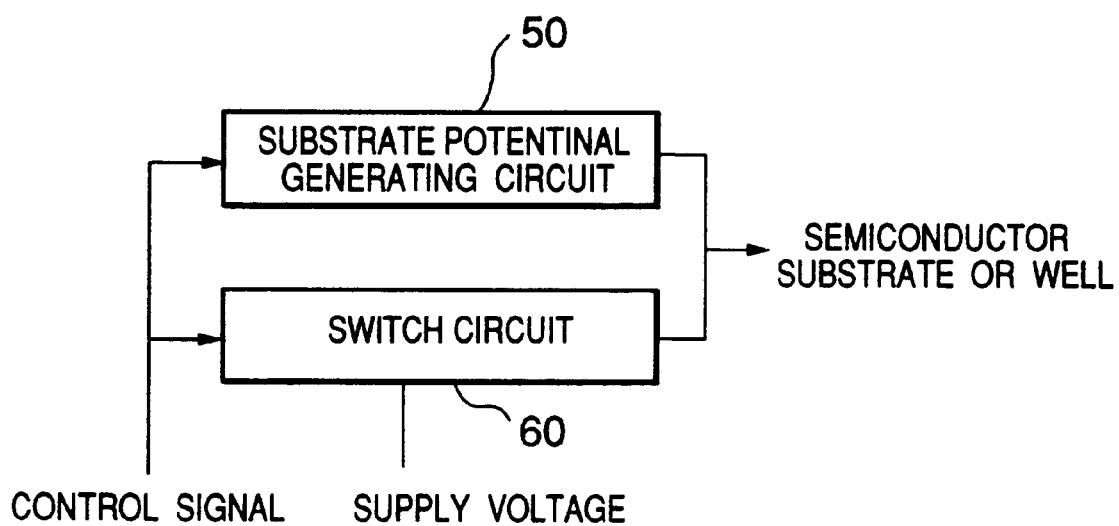
FIG. 3 is a block diagram showing an inspection device used for an inspection method according to the present invention.

Further, in the inspection of the static voltage supply current of the above-mentioned first and second embodiment, although a potential lower than the normal use is applied to the P-type substrate or the P-type well and a potential higher than the normal use is applied to the N-type substrate or the N-type well, instead it is possible to use a device composed of a substrate potential generating circuit 50 and a switch circuit 60 as shown in FIG. 3.

In the case when the device as shown in FIG. 3 is used, in the normal use, the substrate potential generating circuit 50 is deactivated and the switch circuit 60 is activated on the basis of a control signal, to connect the voltage supply to the semiconductor substrate. Further, in the static voltage supply current inspection, the substrate potential generating circuit 50 is activated and the switch circuit 60 is deactivated on the basis of another control signal, to decrease the potential applied to the P-type substrate or the P-type well and to increase the potential applied to the N-type substrate and N-type well.

As a matter of course, the device composed of the substrate potential generating circuit 50 and the switch circuit 60 must be provided separately for the PMOS transistors and the NMOS transistors. These devices are formed in the same chip as that on which the CMOS integrated circuit to be inspected is formed.

Further, the device shown in FIG. 3 is disclosed in further detail by Japanese Patent Application No. 8-80122 filed by the same Applicant.

Further, in the inspection of the static voltage supply current by use of the above-mentioned device, the signals other than the above-mentioned input signals are not changed. That is, the static voltage supply currents are measured under these conditions, and only when the measured value exceeds the predetermined value, the CMOS integrated circuits are selectively rejected, with the result that it is possible to inspect the static voltage supply currents at a high precision.

What is claimed is:

1. The device for inspecting a CMOS integrated circuit device comprising at least one CMOS circuit having at least one P-channel MOS transistor and at least one N-channel MOS transistor; a first pad connected to a source of the P-channel MOS transistor; a second pad connected to a source of the N-channel MOS transistor; a third pad connected to an N-type substrate or an N-type well on which the P-channel MOS transistor is formed; and a fourth pad connected to a P-type substrate or a P-type well on which the N-channel MOS transistor is formed, said device comprises:

first means for applying a first supply potential to the first pad, and a second supply potential lower than the first supply potential to the second pad;

second means for applying a supply potential higher than the first supply potential to the third pad, and a supply potential lower than the second supply potential to the fourth pad; and third means for selectively rejecting the CMOS integrated circuit device on the basis of current flowing through the first or second pad.

2. The device for inspecting a CMOS integrated circuit device comprising at least one CMOS circuit having at least one P-channel MOS transistor and at least one N-channel MOS transistor; a first pad connected to a source of the P-channel MOS transistor; a second pad connected to a source of the N-channel MOS transistor; a third pad connected to an N-type substrate or an N-type well on which the P-channel MOS transistor is formed; and a fourth pad connected to a P-type substrate or a P-type well on which the N-channel transistor is formed, said device comprises:

first means for applying a supply potential higher than first supply potential to the third pad, and a supply potential lower than the second supply potential to the fourth pad; and second means for applying a third supply potential lower than the first supply potential but higher than the second supply potential to the first pad, and a fourth supply potential lower than the third supply potential but higher than the second supply potential to the second pad, the second supply potential being lower than the first supply potential.

* * * * *